United States Patent
Tomimatu

Patent Number: 5,671,165
Date of Patent: Sep. 23, 1997

[54] METHOD OF DETERMINING POSITION OFFSET OF A PATTERN

[75] Inventor: Yoshikatu Tomimatu, Hyogo, Japan

[73] Assignee: Mitsubishi Denki Kabushiki Kaisha, Tokyo, Japan

[21] Appl. No.: 615,764

[22] Filed: Mar. 14, 1996

[30] Foreign Application Priority Data

Sep. 18, 1995  [JP]  Japan .................. 7-238365

[51] Int. Cl.$^6$ .................. G01B 11/03; G03F 9/00
[52] U.S. Cl. .................. 364/571.01; 356/375; 382/145; 382/151
[58] Field of Search .................. 364/488, 489, 364/490, 491, 559, 560, 571.01; 356/375, 399, 400, 401; 382/144, 145, 151

[56] References Cited

U.S. PATENT DOCUMENTS

| | | | |
|---|---|---|---|
| 4,342,090 | 7/1982 | Caccoma et al. | 364/491 |
| 5,493,402 | 2/1996 | Hirukawa | 356/400 |

FOREIGN PATENT DOCUMENTS

| | | |
|---|---|---|
| 1-243419 | 3/1986 | Japan . |
| 61-44429 | 9/1989 | Japan . |
| 6-349705 | 12/1994 | Japan . |

OTHER PUBLICATIONS

Asakura Shoten, SQC Riron Jissai, Sep. 20, 1992, pp. 26–31.

Ian Fink et al, Overlay Sample Plan Optimization for the Detection of Higher Order Contributions to Misalignment, Digital Equipment Corporation, SPIE vol. 2196, 1994.

*Primary Examiner*—James P. Trammell
*Assistant Examiner*—Edward Pipala
*Attorney, Agent, or Firm*—Lowe, Price, LeBlanc & Becker

[57] ABSTRACT

A method of determining position offset is obtained which allows accurate determination of the magnitude of position offset even though the magnitudes of position offset of the outermost shots are not actually measured. According to the method of determining position offset, magnitudes of offset of the designated shots on the surface of a wafer other than the outermost shots are actually measured, and based on the measured magnitudes of offset, the magnitudes of position offset of the outermost shots are calculated and magnitudes of offset are calculated finally taking into consideration the magnitudes of position offset of the outermost shots. As a result, accurate error data can be derived even without actually measuring the magnitudes of offset of the outermost shots.

10 Claims, 9 Drawing Sheets

○ : PATTERNS ORIGINALLY INTENDED TO BE MEASURED

× : MEASURED PATTERNS

X : MEASURED PATTERNS

METHOD OF DETERMINING POSITION OFFSET OF A PATTERN

BACKGROUND OF THE INVENTION

1. Field of the Invention

The present invention relates to determination methods of position offset and, more particularly, to a method of determining position offset or overlay shift of a pattern in the step of inspecting a semiconductor wafer.

2. Description of the Background Art

Recently, semiconductor devices such as ICs and LSIs have been increasingly reduced in size. Especially, exposure devices for transferring a circuit pattern on a mask or reticle onto a circuit pattern formed on a semiconductor wafer are required to achieve increasingly high precision. With increase in integration level of devices, precision of 0.20 μm to 0.10 μm is required and even precision of 0.10 μm or smaller is required these days.

Figure 6:
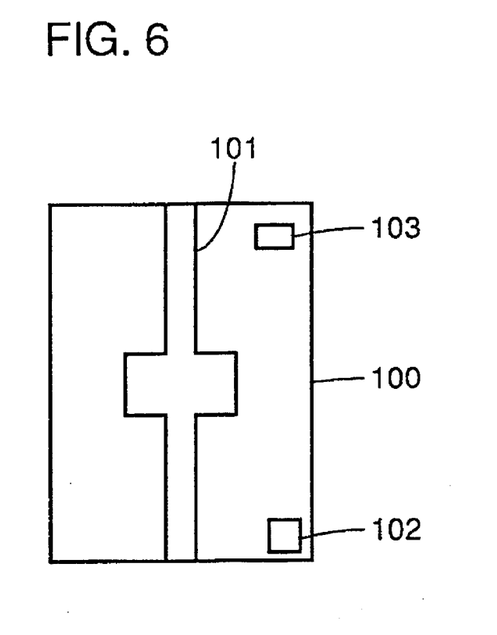
FIG. 6 is a plan view showing a first reticle mask used in a conventional method of manufacturing overlay patterns.
Figure 7:
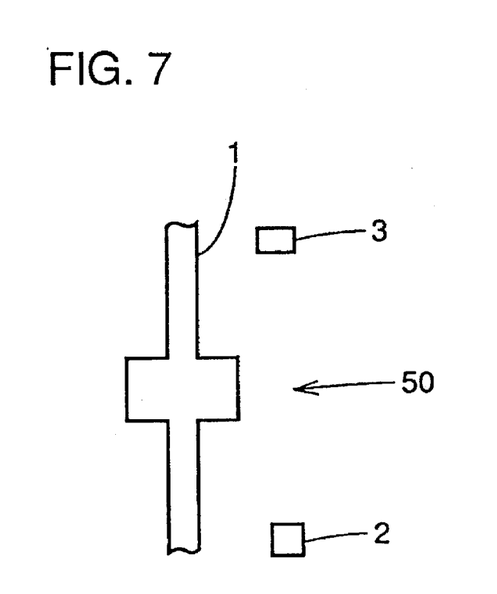
FIG. 7 is a plan view showing a first formation pattern formed by the first reticle mask shown in FIG. 6.
Figure 8:
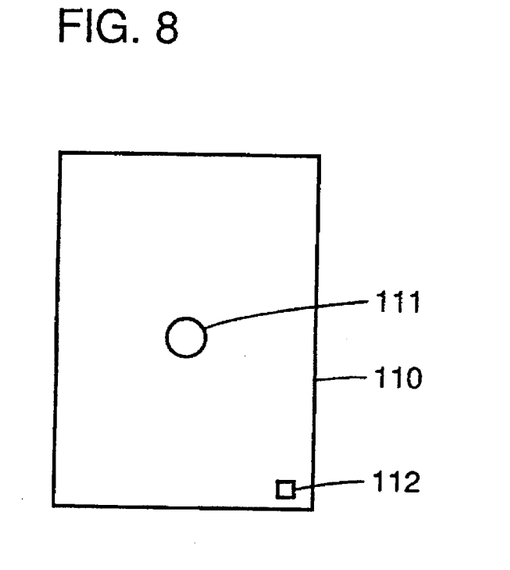
FIG. 8 is a plan view showing a second reticle mask used in a conventional method of manufacturing overlay patterns.

FIGS. 6–9 are plan views illustrating the process for manufacturing a displacement detection mark used for determining position offset or displacement. FIGS. 6 and 8 are plan views showing reticle masks 100 and 110 used for first and second patterning steps, respectively.

First reticle mask 100 shown in FIG. 6 includes a first mask pattern 101, a pattern 102 for a first displacement detection mark, and a pattern 103 for alignment mark. By transferring the mask pattern with use of first reticle mask 100, a first formation pattern 1, a first displacement detection mark 2 and an alignment mark 3 are formed on a surface of a wafer 50 as shown in FIG. 7.

Figure 9:
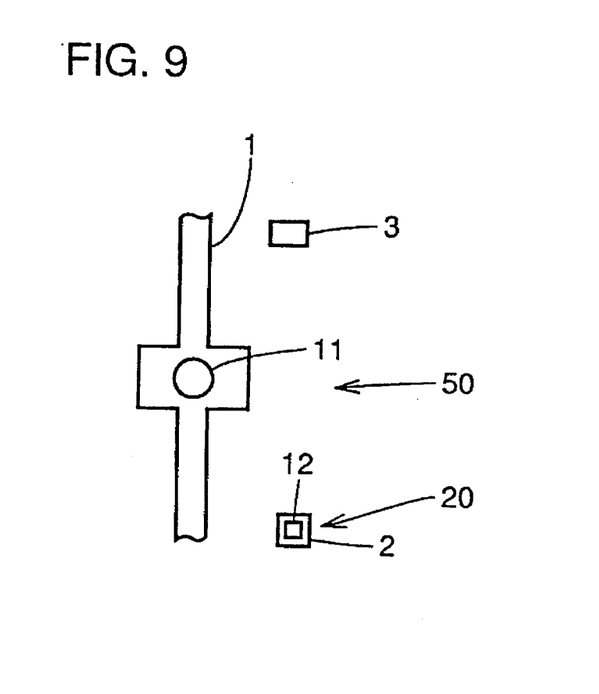
FIG. 9 is a plan view showing a second formation pattern formed on the first formation pattern shown in FIG. 7 by using the second reticle mask shown in FIG. 8.

Subsequent to the step shown in FIG. 7, the step of depositing a predetermined layer and others are carried out and the mask pattern is transferred again by employing second reticle mask 110 shown in FIG. 8. Second reticle mask 110 includes a second mask pattern 111 and a pattern 112 for a second displacement detection mark. By transferring the mask pattern with use of such second reticle mask 110, a second formation pattern 11 and a second displacement detection mark 12 are formed as shown in FIG. 9.

The offset in position between first and second formation patterns 1 and 11 is detected by obtaining the magnitude of displacement between first and second displacement detection marks 2 and 12. These first and second displacement detection marks 2 and 12 are called a Box-in-Box mark 20.

Figure 10:
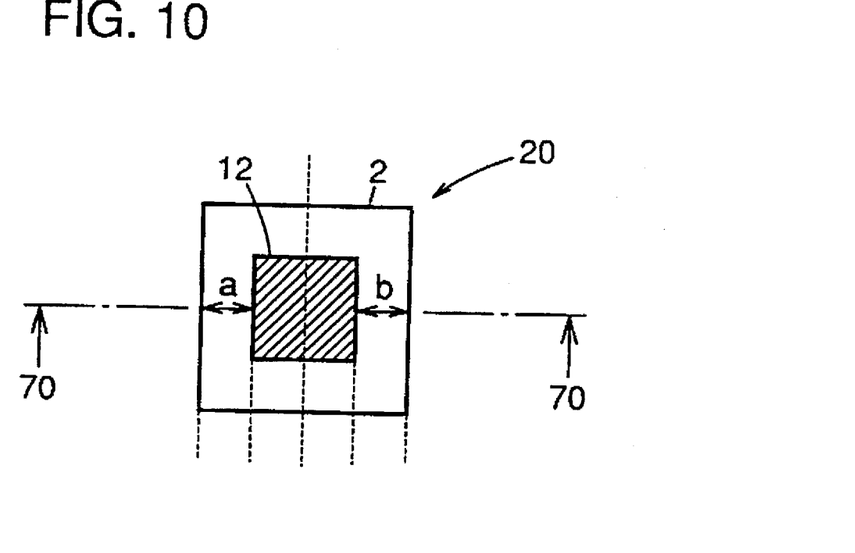
FIG. 10 is a plan view showing a Box-in-Box mark for determining offset in position between the first and second formation patterns shown in FIG. 9.
Figure 11:
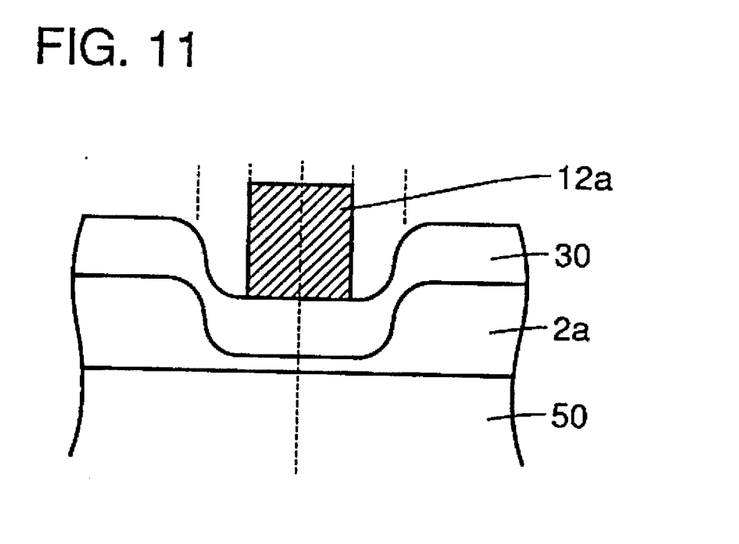
FIG. 11 is a cross sectional view taken along the line 70—70 of the Box-in-Box mark shown in FIG. 10.
Figure 12:
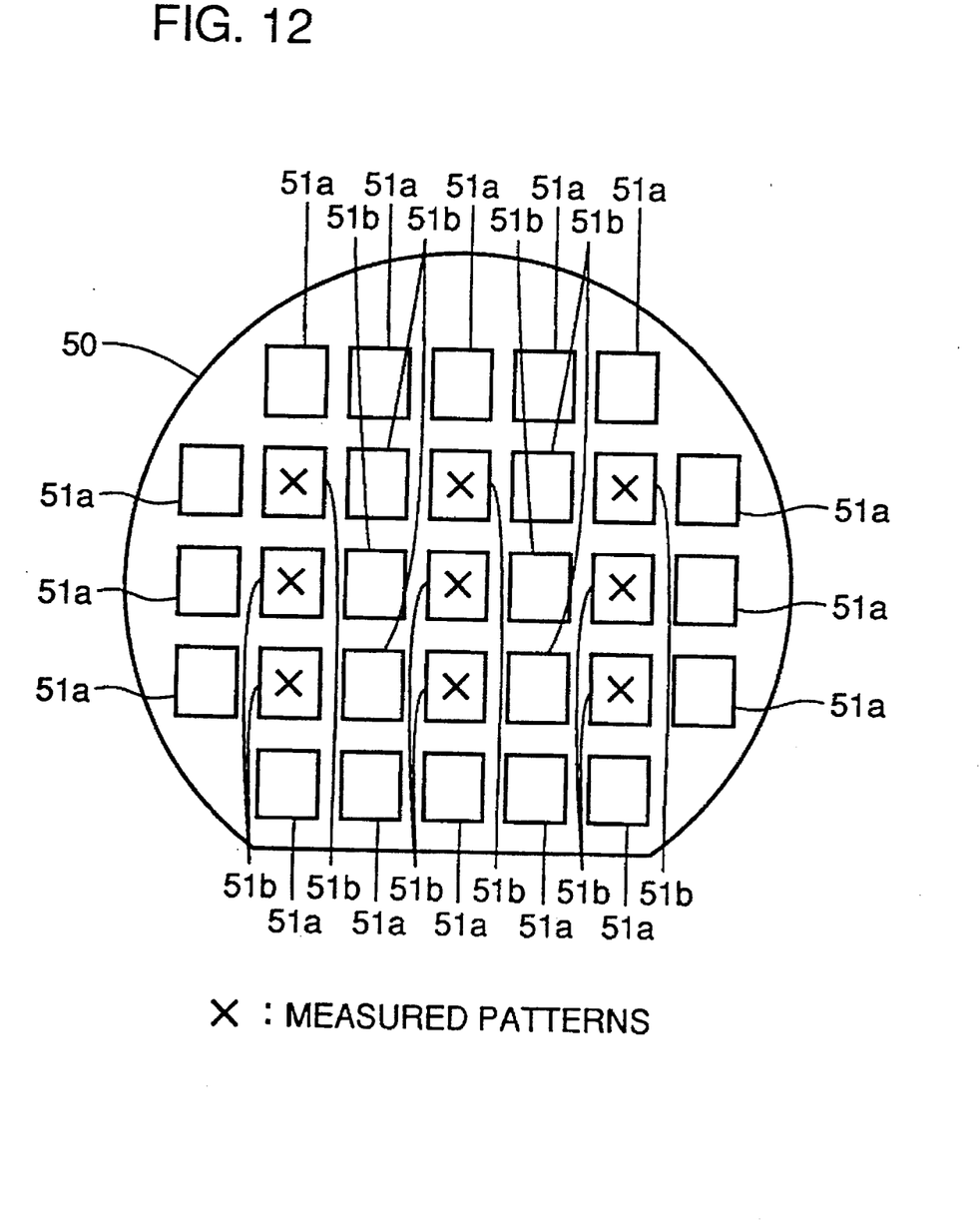
FIG. 12 is a plan view showing a conventional measurement pattern for determining offset in position.

FIG. 10 is a plan view showing the enlarged part of Box-in-Box mark 20 shown in FIG. 9, and FIG. 11 is a cross sectional view taken along the line 70—70 in FIG. 10. Referring to FIG. 11, a first layer 2a corresponding to first displacement detection mark 2 is formed on a main surface of wafer 50, and a deposition film 30 is formed to cover first layer 2a. A second layer 12a corresponding to second displacement detection mark 12 is formed on deposition film 30. The magnitude of displacement or offset in position between first and second displacement detection marks 2 and 12 is generally measured by image recognition. Such light source as a xenon lamp emitting light with a broad band is employed. By detecting the intensity of light reflecting from the vicinity of the edges of first and second displacement detection marks 2 and 12, the positions of the edges of first and second displacement detection marks 2 and 12 are recognized. By applying distances (a) and (b) shown in FIG. 10 to the following equation (1), the magnitude of offset between first and second formation patterns 1 and 11 is calculated.

$$\text{The magnitude of offset in position} = (a-b)/2 \quad (1)$$

According to the conventional method, the magnitude of offset in position between first and second formation patterns 1 and 11 shown in FIG. 9 is thus detected.

The pattern formed by first and second formation patterns 1 and 11 as shown in FIG. 9 is formed for each unit pattern on wafer 50. Accordingly, Box-in-Box mark 20 is formed for each unit pattern. More specifically, a plurality of unit pattern 51a and 51b are formed on the surface of wafer 50, and Box-in-Box mark 20 is formed for each unit patterns 51a, 51b.

At the region proximate to Box-in-Box mark 20 of unit pattern 51a located outermost on wafer 50, pattern densities are different at the outer portion (closer to the outer periphery of wafer 50) and the inner portion (closer to the center of wafer 50). More specifically, the inner side of the outermost Box-in-Box mark 20 has a higher pattern density because of unit pattern 51b, while the outer side thereof has a lower pattern density since there is no unit pattern. Such a difference in pattern density between the inner side and the outer side of the outermost Box-in-Box mark 20 may result in asymmetry in the covering characteristics (coverage) of a layer formed at Box-in-Box mark 20 portion.

Figure 13:
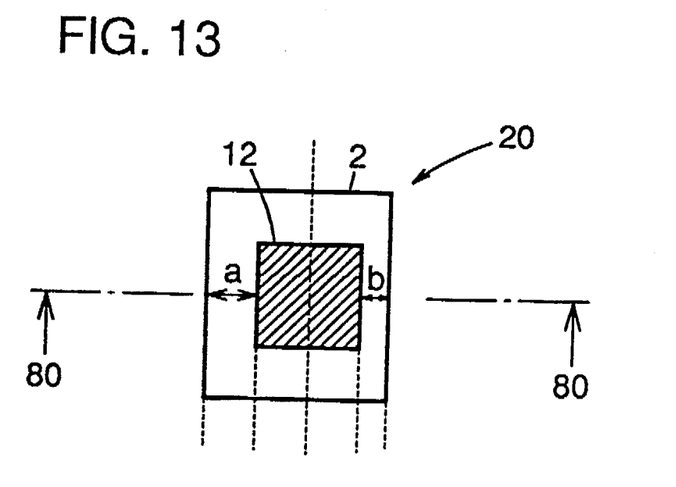
FIG. 13 is a plan view illustrating problems of the conventional method of determining offset in position.
Figure 14:
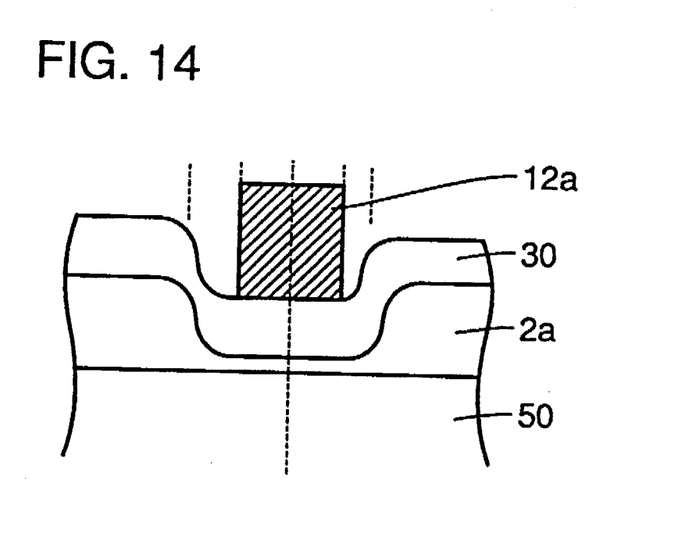
FIG. 14 is a cross sectional view taken along the line 80—80 of the Box-in-Box mark shown in FIG. 13.

FIGS. 13 and 14 are a plan view and a cross sectional view, respectively, illustrating such state. FIG. 14 is a cross sectional view taken along the line 80—80 in FIG. 13. Referring to FIG. 14, first and second layers 2a and 12a are provided symmetrically with respect to the central line (dotted line). The intermediate layer 30, however, is not formed symmetrically with respect to the central line, whereby first and second displacement detection marks 2 and 12 are recognized as if they were arranged as shown in FIG. 13. Therefore, Box-in-Box mark 20 of the outermost unit pattern is measured erroneously as if there were a displacement, even though first and second layers 2a and 12a are symmetrical with respect to the central line. Therefore, according to the conventional method of measuring offset in position, a prescribed unit pattern 51b among the inner unit patterns 51b is measured for offset in position and unit pattern 51a located outermost on wafer 50 is not measured.

However, since offset in position is usually greater at the outer region of wafer 50, accurate detection of offset in position cannot be achieved without taking into consideration the position offset data at the outermost region. In addition, the data obtained when a small number of unit patterns 51b are measured lacks reliability and therefore giving rise to a problem that calculation of accurate magnitude of displacement is difficult.

SUMMARY OF THE INVENTION

The present invention solves the above-described problems, and one object of the present invention is to provide a method of determining position offset that can detect accurate magnitude of displacement even without measuring position offset data at the outermost region of a substrate to be processed.

Another object of the present invention is to provide a method of determining position offset that allows accurate calculation of position offset even with a small number of pieces of measurement data.

According to one aspect of the present invention, the method of determining position offset relates to a method of determining a position offset on a substrate to be processed which has a plurality of unit patterns arranged on a main surface thereof. According to the method of determining position offset, position offset data is measured at a plurality of predetermined unit patterns other than the unit patterns located outermost on the substrate to be processed among the unit patterns on the processed substrate. Based on the measured position offset data, a predetermined error parameter is calculated. Based on the error parameter, a first linear error component of the unit pattern for which the position offset data is measured is calculated as a linear error. By subtracting each first linear error component thus calculated from the corresponding piece of position offset data measured, a first random error component of the unit pattern for which the position offset data is measured is calculated as a random error. Based on the error parameter, a second linear error component of the unit pattern located outermost on the substrate to be processed is calculated as a linear error. Based on one random error component, a second random error component corresponding to the second linear error component is calculated. Error data is calculated by adding each second linear error component and the corresponding second random error component. According to the present invention, position offset data at the unit pattern other than the outermost unit pattern on the substrate to be processed is measured, the second linear error component of the outermost unit pattern on the substrate to be processed is calculated based on the measured data, and error data is calculated by adding the second linear component and the corresponding second random error component, so that magnitude of offset in position is determined taking the error data at the outermost region into account. Thus, offset in position can be determined more accurately than a conventional method.

In a method of determining offset in position according to another aspect of the present invention, position offset data is measured at a plurality of predetermined unit patterns other than the unit pattern located outermost on a substrate to be processed among the unit patterns on the substrate. A predetermined error parameter is calculated based on the measured position offset data. Based on the error parameter, a first linear error component of the unit pattern for which position offset data is measured is calculated as a linear error. By subtracting each calculated first linear component from the corresponding position offset data thus measured, a first random error component of the unit pattern for which position offset data is measured is calculated as a random error. Based on the error parameter, a second linear error component of each of the all unit patterns on the substrate to be processed is calculated as a linear error. Based on the first random error component of the unit pattern for which position offset data is measured, a second random error component corresponding to the second linear error component is calculated. Error data of all unit patterns is calculated by adding each second linear error component of all the unit patterns and corresponding second random error component. According to the present invention, position offset data at the predetermined unit patterns other than the outermost unit pattern is measured, the second linear component and the second random error component of every unit pattern are calculated based on the measured data, and error data of all the unit patterns is obtained based on the calculated result, whereby the magnitude of displacement is obtained by taking into account the magnitude of displacement of all the unit patterns including the outermost unit pattern. Consequently, the magnitude of offset in position can be determined more accurately than a conventional method. Furthermore, yield in the measuring step is improved since accuracy in measurement is improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, embodiments of the present invention will be described with reference to the drawings.

Figure 1:
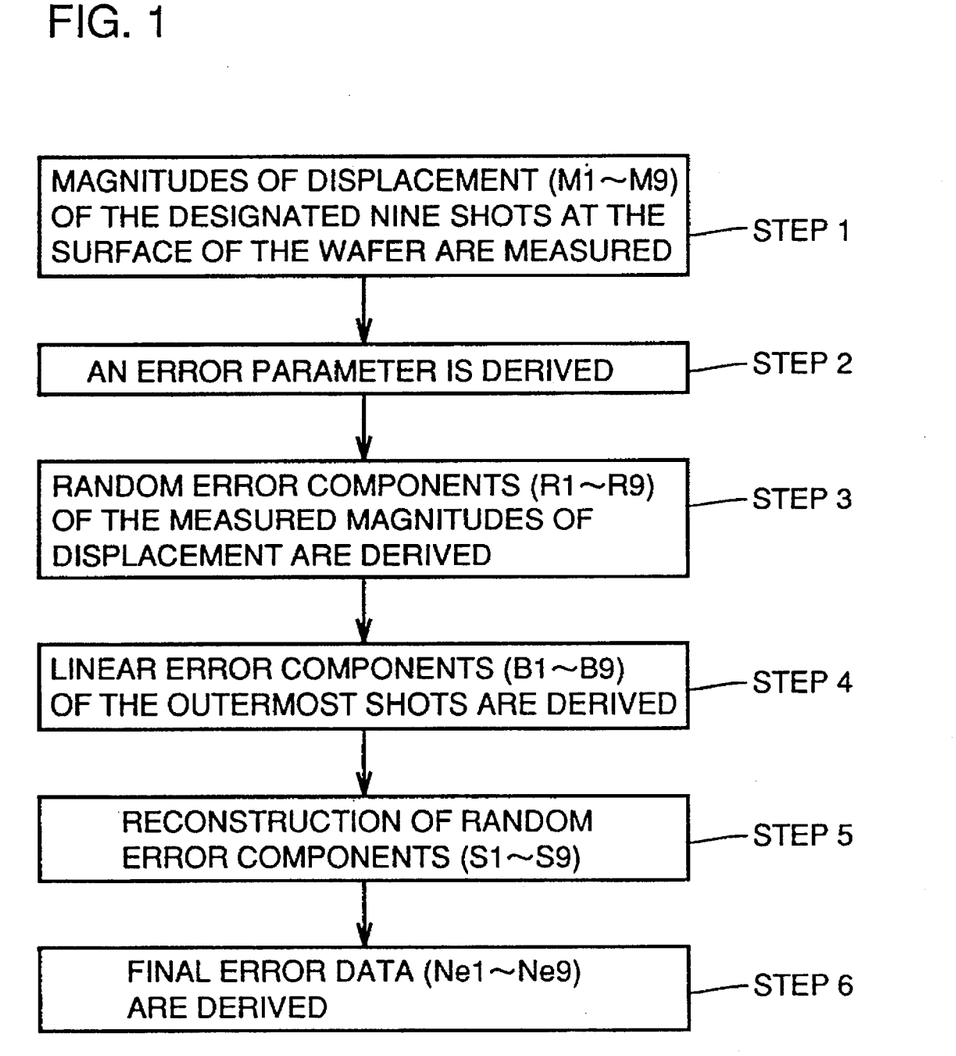
FIG. 1 is a flow chart for use in illustration of a method of determining offset in position according to a first embodiment of the present invention.
Figure 2:
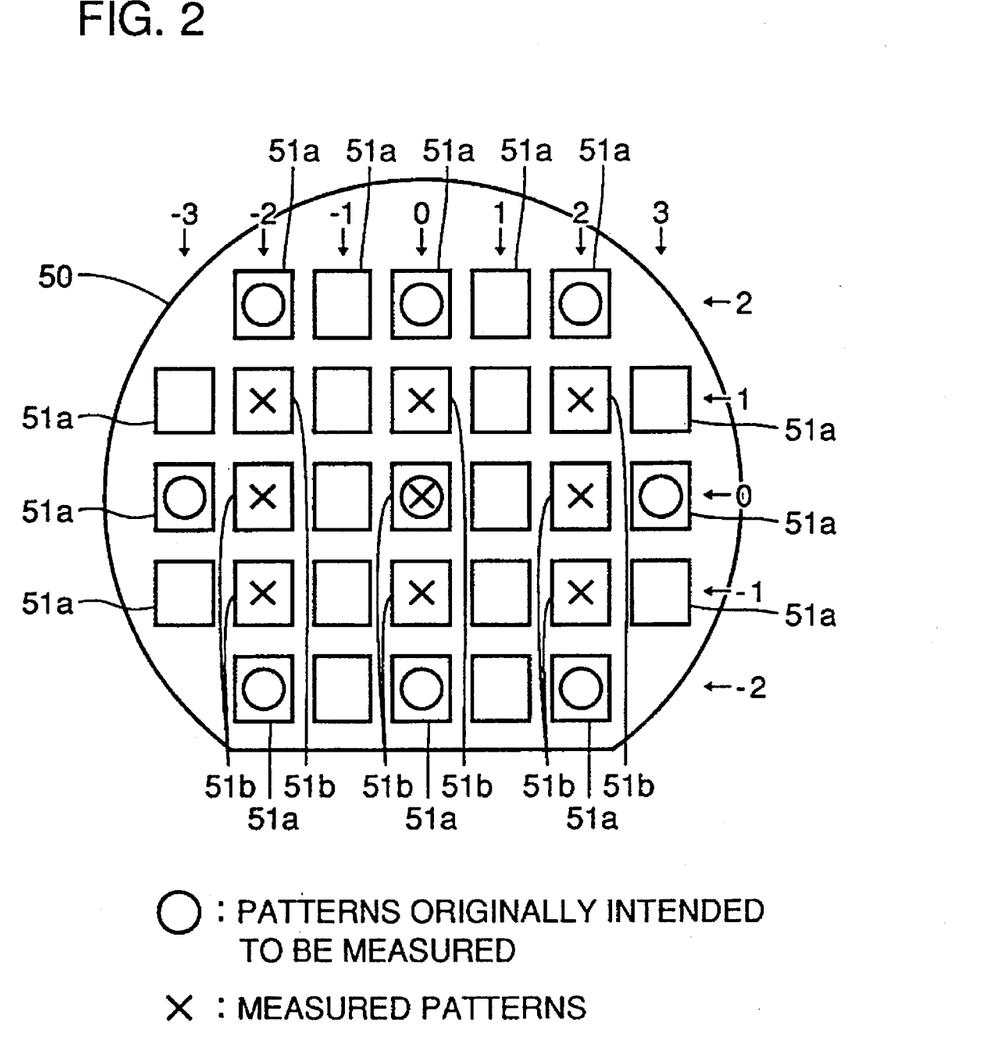
FIG. 2 is a plan view showing a pattern to be actually measured and a pattern originally intended to be measured.

Referring to FIGS. 1 and 2, the flow for determining offset in position according to the first embodiment will be described below. First, the magnitude of offset in position or displacement is measured for nine unit patterns 51b (measured patterns) which are not located at the outermost region as shown in FIG. 2 (Step 1). The measured magnitude of displacement and the coordinates of the shot position of each of the nine measured shots are shown in Table 1 below.

TABLE 1

| Coordinates of the Shot Position | | | Measured Magnitudes of Displacement (μm) | |
|---|---|---|---|---|
| | X Coordinate | Y Coordinate | (X) | (Y) |
| 1 | 2 | 1 | M1 −0.048 | −0.055 |
| 2 | 0 | 1 | M2 −0.061 | −0.036 |
| 3 | −2 | 1 | M3 −0.045 | −0.039 |
| 4 | −2 | 0 | M4 −0.041 | −0.055 |
| 5 | 0 | 0 | M5 −0.042 | −0.043 |
| 6 | 2 | 0 | M6 −0.036 | −0.033 |

TABLE 1-continued

| | Coordinates of the Shot Position | | Measured Magnitudes of Displacement (μm) | | |
|---|---|---|---|---|---|
| | X Coordinate | Y Coordinate | | (X) | (Y) |
| 7 | 2 | −1 | M7 | −0.022 | −0.025 |
| 8 | 0 | −1 | M8 | −0.016 | −0.034 |
| 9 | −2 | −1 | M9 | −0.043 | −0.051 |

Referring to Table 1, the X and Y coordinates of the shot position correspond to the X coordinate in a range of −3 through 3 and the Y coordinate in a range of −2 through 2 shown in FIG. 2, respectively. Based on the measured magnitudes of displacement M1–M9, six error parameters (X offset, Y offset, X scaling, Y scaling, X rotation, and Y rotation) are derived. Here, X offset and Y offset mean the magnitudes of displacement of the entire wafer 50 in directions of X axis and Y axis, respectively. X scaling and Y scaling indicate the magnitudes of displacement due to expansion and shrinkage of wafer 50 in the directions of X and Y axes. X rotation and Y rotation indicate the magnitudes of displacement due to rotation of X and Y axes of wafer 50, respectively. As a result of calculation based on the measured magnitudes of displacement M1–M9, the six error parameters mentioned above attain the following values.

X offset=−0.03878 μm

Y offset=−0.04122 μm

X scaling=0.11017 ppm

Y scaling=−0.14749 ppm

X rotation=0.50147 μrad

Y rotation=0.12591 μrad

These six error parameters can be easily obtained from the measured magnitudes of displacement M1–M9 described above by using least squares method. The method of obtaining the error parameters from the measured displacement data by using least squares method is already known and disclosed in detail in, for example, Japanese Patent Laying-Open No. 6-349705.

By applying the six error parameters thus derived to the following equations (2) and (3), linear error components $_\Delta X$ and $_\Delta Y$ of the measured data are calculated.

$$_\Delta X = \text{X offset} + \text{X coordinate} \cdot \text{X scaling} + \text{X coordinate} \cdot \text{X rotation} \quad (2)$$

$$_\Delta Y = \text{Y offset} + \text{Y coordinate} \cdot \text{Y scaling} + \text{Y coordinate} \cdot \text{Y rotation} \quad (3)$$

Linear error components $_\Delta X$ and $_\Delta Y$ of the measured magnitudes of displacement obtained in accordance with the equations (2) and (3) above are subtracted from X and Y components of the measured magnitudes of displacement (M1–M9) indicated in Table 1, respectively, thereby calculating random error components (R1–R9) of the measured magnitudes of displacement shown in Table 2 (Step 3).

TABLE 2

| | Coordinates of the Shot Position | | Random Error Component (μm) | | |
|---|---|---|---|---|---|
| | X Coordinate | Y Coordinate | | (X) | (Y) |
| 1 | 2 | 1 | R1 | 0.002 | −0.016 |
| 2 | 0 | 1 | R2 | −0.011 | 0.009 |
| 3 | −2 | 1 | R3 | 0.01 | 0.011 |
| 4 | −2 | 0 | R4 | 0.002 | −0.008 |

TABLE 2-continued

| | Coordinates of the Shot Position | | Random Error Component (μm) | | |
|---|---|---|---|---|---|
| | X Coordinate | Y Coordinate | | (X) | (Y) |
| 5 | 0 | 0 | R5 | −0.003 | −0.002 |
| 6 | 2 | 0 | R6 | −0.002 | 0.003 |
| 7 | 2 | −1 | R7 | 0.001 | 0.008 |
| 8 | 0 | −1 | R8 | 0.011 | 0.004 |
| 9 | −2 | −1 | R9 | −0.011 | −0.008 |

Next, linear error components (B1–B9) of the patterns (shots) 51a which are originally intended to measure are derived by employing the error parameters and equations (2) and (3) obtained in Step 2 (Step 4). Linear error components (B1–B9) of the outermost shots are shown in Table 3 below.

TABLE 3

| | Coordinates of the Outermost Shot | | Linear Error Component (μm) | | |
|---|---|---|---|---|---|
| | X Coordinate | Y Coordinate | | (X) | (Y) |
| 1 | 2 | 2 | B1 | −0.057 | −0.043 |
| 2 | 0 | 2 | B2 | −0.061 | −0.048 |
| 3 | −2 | 2 | B3 | −0.066 | −0.053 |
| 4 | −3 | 0 | B4 | −0.046 | −0.049 |
| 5 | 0 | 0 | B5 | −0.039 | −0.041 |
| 6 | 3 | 0 | B6 | −0.032 | −0.033 |
| 7 | 2 | −2 | B7 | −0.011 | −0.029 |
| 8 | 0 | −2 | B8 | −0.016 | −0.035 |
| 9 | −2 | −2 | B9 | −0.021 | −0.040 |

It is assumed that random error components (R1–R9) of the measured magnitudes of displacement obtained in Step 3 exhibit normal distribution since the number of pieces of data is nine. Therefore, the variation range thereof is approximately 3 σ statistically (or 2.970 σ, if stated more accurately). The range of random error components (R1–R9) of the measured magnitudes of displacement is doubled to 6 σ. By making a correspondence of random digits to the distributed data in the range of 6 σ, random error components (S1–S9) are formed corresponding to each of the shots (nine shots) of the linear error components obtained in Step 4 (Step 5). The random error components (S1–S9) are shown in Table 4 below. While the range of the random error components is doubled to 6 σ in the present embodiment since there are nine pieces of the measured data and the range thereof is about 3 σ statistically, the present invention is not so limited. Since the statistic range is determined by the number of pieces of the measured data, the range can be expanded by multiplying the range by a number to be 6 σ. For example, if four pieces of the measured data are obtained, the range thereof is approximately 2 σ and therefore the range is tripled to 6 σ. The relation between the number (n) of the pieces of the measured data and the variation range ($d_2 \cdot \sigma$) of the measured data is indicated, for example, in Table 3.2 in *SQC Ronri To Jissai*, Asakura Shoten, published in 1992, pp. 28.

TABLE 4

| | Coordinates of the Shot Position | | Random Error Component (μm) | | |
|---|---|---|---|---|---|
| | X Coordinate | Y Coordinate | | (X) | (Y) |
| 1 | 2 | 2 | S1 | −0.007 | −0.018 |
| 2 | 0 | 2 | S2 | −0.001 | −0.009 |
| 3 | −2 | 2 | S3 | 0.005 | 0.001 |

TABLE 4-continued

| | Coordinates of the Shot Position | | | Random Error Component (μm) | |
|---|---|---|---|---|---|
| | X Coordinate | Y Coordinate | | (X) | (Y) |
| 4 | −3 | 0 | S4 | −0.012 | 0.016 |
| 5 | 0 | 0 | S5 | 0.009 | 0.009 |
| 6 | 2 | 0 | S6 | −0.001 | −0.019 |
| 7 | 2 | −2 | S7 | 0.011 | −0.005 |
| 8 | 0 | −2 | S8 | 0.008 | 0.006 |
| 9 | −2 | −2 | S9 | 0.005 | −0.014 |

Next, linear error components (B1–B9) obtained in Step 4 are added to random error components (S1–S9) obtained in Step 5, thereby deriving final error data (Ne1–Ne9) (Step 6). The final error data (Ne1–Ne9) thus derived is shown in Table 5 below.

TABLE 5

| | Coordinates of the Shot Position | | | Error Data (μm) | |
|---|---|---|---|---|---|
| | X Coordinate | Y Coordinate | | (X) | (Y) |
| 1 | 2 | 2 | Ne1 | −0.064 | −0.061 |
| 2 | 0 | 2 | Ne2 | −0.062 | −0.057 |
| 3 | −2 | 2 | Ne3 | −0.061 | −0.052 |
| 4 | −3 | 0 | Ne4 | −0.058 | −0.033 |
| 5 | 0 | 0 | Ne5 | −0.03 | −0.032 |
| 6 | 3 | 0 | Ne6 | −0.033 | −0.052 |
| 7 | 2 | −2 | Ne7 | 0 | −0.034 |
| 8 | 0 | −2 | Ne8 | −0.008 | −0.029 |
| 9 | −2 | −2 | Ne9 | −0.016 | −0.054 |

Thereafter, based on the error data obtained by Step 6 above, the average magnitude of displacement and standard deviation of the magnitudes of displacement are obtained. More specifically, the average magnitude of displacement is acquired by taking the average of error data (Ne1–Ne9), while standard deviation of magnitudes of displacement is obtained as follows.

Figure 3:
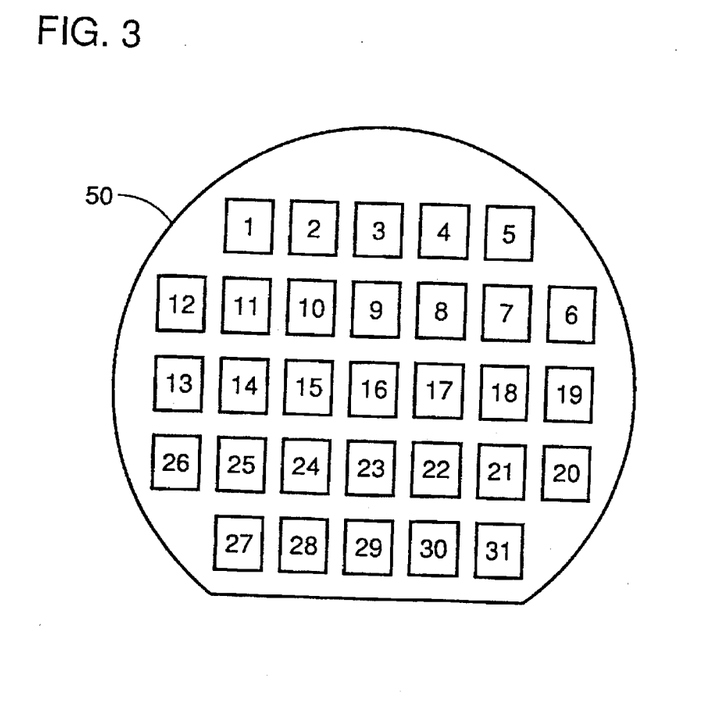
FIG. 3 is a plan view showing an arrangement of a plurality of unit patterns on a surface of a wafer.
Figure 4:
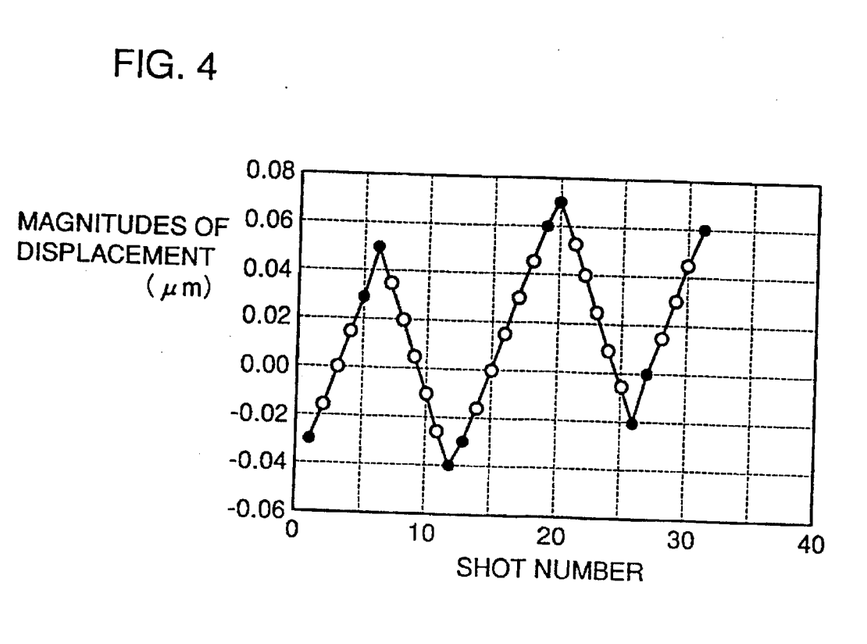
FIG. 4 shows a relationship between the magnitude of displacement and shot numbers of the unit patterns shown in FIG. 3.

Referring to FIGS. 3 and 4, distribution of magnitudes of displacement at the surface of wafer 50 shows a tendency that the shot close to the outer periphery of wafer 50 has a greater magnitudes of displacement. Thus, the range (difference between the maximum value and the minimum value) of final error data (Ne1–Ne9) of Step 6 derived based on the linear error components of the outermost shots in Step 4 can be considered as 6 σ. As a result, the range 3 σ of the magnitude of displacement can be expressed by the following equation (4).

$$3\sigma = \text{the range of data in Step 6}/2 \quad (4)$$

In accordance with a method of calculating the magnitude of position offset in the first embodiment, offset data of the outermost shots can be taken into consideration upon calculation even though the offset data of the outermost shots are not actually measured, so that more accurate magnitude of displacement can be determined than a conventional method. In addition, even with a small number of pieces of measured data, the magnitude of displacement close to the real data can be calculated, thereby enhancing accuracy in judging whether the wafer has a failure or not so as to improve yield.

Second Embodiment

Figure 5:
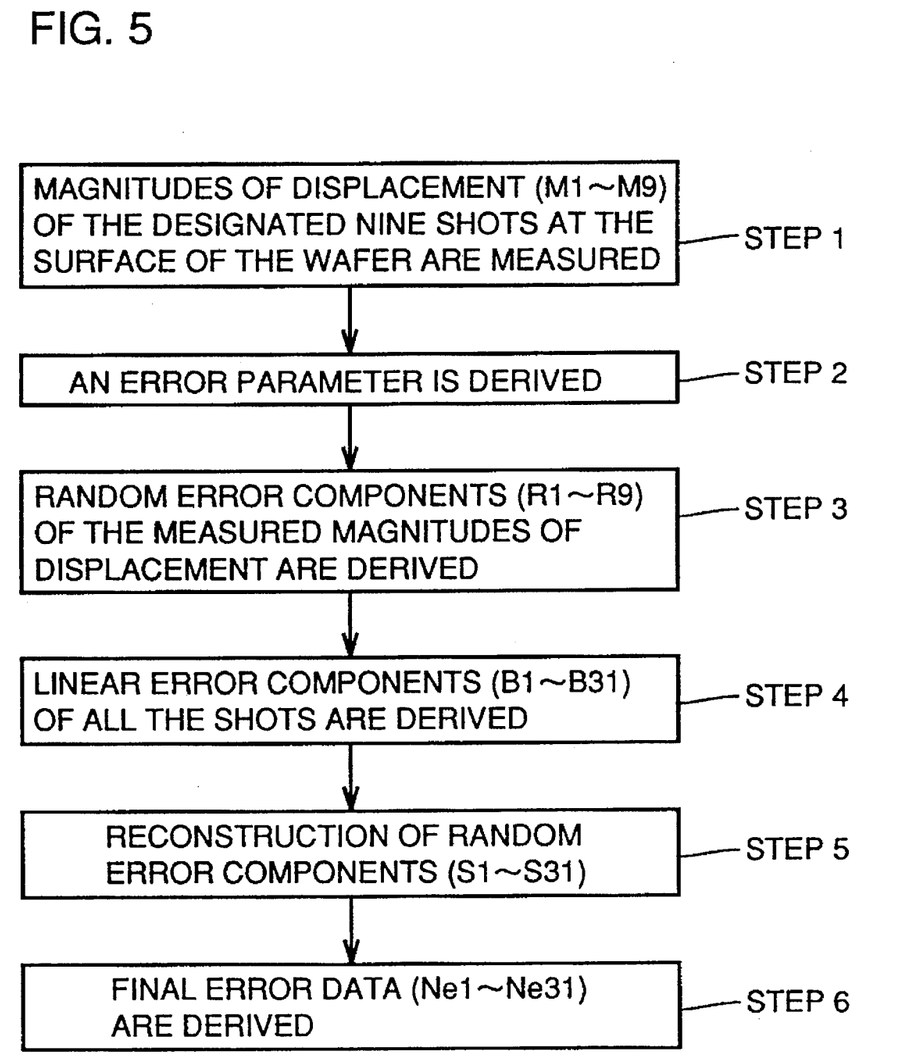
FIG. 5 is a flow chart for use in illustration of a method of determining offset in position according to a second embodiment of the present invention.

Referring to FIG. 5, Steps 1–3 in the second embodiment are performed similarly to the Steps 1–3 in the first embodiment shown in FIG. 1.

As a subsequent step, in the second embodiment, linear error components (B1–B31) for all of the shots on the surface of the wafer are derived based on the error parameters obtained in step 2.

It is assumed that the random error components (R1–R9) of the measured magnitudes of displacement in Step 3 shows normal distribution because the number of pieces of data measured is nine. The range thereof is, therefore, about 3 σ statistically. Accordingly, the range of random error components (R1–R9) is doubled to 6 σ, and a correspondence is made between random digits and distributed data. Then, random error components (S1–S31) are obtained corresponding to each of the shots acquired in Step 4 (Step 5).

Linear error components (B1–B31) in Step 4 are added to random error components (S1–S31) in Step 5, thereby obtaining final error data (Ne1–Ne31) (Step 6).

Finally, the average magnitude of displacement and standard deviation of the magnitudes of displacement are calculated based on the error data obtained in step 6.

According to the second embodiment, the magnitudes of displacement of nine shots are actually measured and linear error components corresponding to all the shots are derived to obtain final error data, so that the magnitude of displacement even closer to the real data than the first embodiment can be calculated. As a result, accuracy in judging whether the wafer lot has a failure or not is enhanced, thereby obtaining effects of improving yield even further.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of determining position offset of a substrate to be processed having a plurality of unit patterns arranged on a main surface thereof, comprising the steps of:
   measuring position offset data at a plurality of predetermined unit patterns other than the unit patterns located outermost on said processed substrate among the unit patterns of said processed substrate;
   calculating a predetermined error parameter based on said position offset data measured;
   calculating a first linear error component of the unit pattern for which said position offset data is measured based on said error parameter;
   calculating a first random error component of the unit pattern for which said position offset data is measured by subtracting said measured first linear component from said position offset data measured corresponding thereto;
   calculating a second linear error component of the unit pattern located outermost on said processed substrate based on said error parameter;
   calculating a second random error component corresponding to said second linear error component based on said first random error; and
   calculating error data by adding each said second linear error component and said second random error component corresponding thereto.

2. The method of determining position offset according to claim 1, wherein the plurality of unit patterns for which said position offset data is measured are arranged symmetrically with respect to the center of said substrate to be processed.

3. The method of determining position offset according to claim 1, wherein said error parameter includes an X offset error which is a displacement in a direction of an X axis of said processed substrate having X and Y axes perpendicular to each other, a Y offset error which is a displacement in a direction of a Y axis of said processed substrate having the X and Y axes perpendicular to each other, an X expansion and shrinkage error which is a displacement due to expansion and shrinkage in the direction of the X axis of said processed substrate, a Y expansion and shrinkage error which is a displacement due to expansion and shrinkage in the direction of the X axis of said processed substrate, an X rotation error which is a displacement due to rotation of the X axis of said processed substrate, and Y rotation error which is a displacement due to rotation of the Y axis of said processed substrate; and said six error parameters are calculated by least squares method based on said position offset data measured.

4. The method of determining position offset according to claim 1, wherein said second random error component is calculated by multiplying by a predetermined number a variation range of said first random error component so that the variation range which is a difference between the maximum value and the minimum value of said first random error component is 6 × standard deviation and making a correspondence of random digit to distributed data of said first random error component in the variation range.

5. The method of determining position offset according to claim 1, further comprising the steps of obtaining an average magnitude of offset by taking an average of said error data and dividing by 2 said variation range which is a difference between the maximum value and the minimum value of said error data to obtain 3 × standard deviation of magnitudes of offset.

6. A method of determining position offset of a substrate to be processed having a plurality of unit patterns arranged on a main surface thereof, comprising steps of:

measuring position offset data at a plurality of predetermined unit patterns other than the unit pattern located outermost on said processed substrate among the unit patterns on said processed substrate;

calculating a predetermined error parameter based on said position offset data measured;

calculating a first linear error component of the unit pattern for which said position offset data is measured based on said error parameter; and calculating a first random error component of the unit pattern for which position offset data is measured by subtracting each said first linear error component calculated from said position offset data measured corresponding thereto;

calculating a second linear component of each of the all unit patterns of said processed substrate based on said error parameter;

calculating a second random error component corresponding to said second linear error component based on said first random error of the unit pattern for which said position offset data is measured; and calculating error data of said all unit patterns by adding each said second linear error component of said all unit patterns and said random error component corresponding thereto.

7. The method of determining position offset according to claim 6, wherein the plurality of unit patterns for which said position offset data is measured are arranged symmetrically with respect to the center of said substrate to be processed.

8. The method of determining position offset according to claim 6, wherein said error parameter includes an X offset error which is a displacement in a direction of an X axis of said processed substrate having X and Y axes perpendicular to each other, a Y offset error which is a displacement in a direction of the Y axis of said processed substrate having the X and Y axes perpendicular to each other, an X expansion and shrinkage error which is a displacement due to expansion and shrinkage of said processed substrate in the direction of the X axis, an Y expansion and shrinkage error which is a displacement due to expansion and shrinkage of said processed substrate in the direction of the Y axis, an X rotation error which is a displacement due to rotation of the X axis of said processed substrate, and a Y rotation error which is a displacement due to rotation of the Y axis of said processed substrate; and said six error parameters are calculated by least squares method based on said position offset data measured.

9. The method of determining position offset according to claim 6, wherein said second random error component is calculated by multiplying by a predetermined number a variation range of said first random error component so that the variation range which is a difference between the maximum value and the minimum value of said first random error component is 6 × standard deviation and making correspondence between random digit and distributed data of said first random error component in the variation range.

10. The method of determining position offset according to claim 6, further comprising the step of obtaining an average magnitude of offset by taking an average of error data of said all unit patterns and calculating standard deviation of magnitudes of offset based on the error data of said all unit patterns.

* * * * *